(12) United States Patent
Shieh et al.

(10) Patent No.: US 8,067,780 B2
(45) Date of Patent: Nov. 29, 2011

(54) LIGHT EMITTING DEVICE AND THE MANUFACTURE METHOD THEREOF

(75) Inventors: Yuh-Ren Shieh, Hsinchu (TW); Hsuan-Cheng Fan, Hsinchu (TW); Jin-Ywan Lin, Hsieh (TW); Cheng-Yi Hsu, Hsinchu (TW); Chung-Kuei Huang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 957 days.

(21) Appl. No.: 11/896,661

(22) Filed: Sep. 5, 2007

(65) Prior Publication Data

US 2008/0054290 A1 Mar. 6, 2008

(30) Foreign Application Priority Data

Sep. 5, 2006 (TW) .............................. 95132845 A (51) Int. Cl.
*H01L 33/00* (2010.01)
(52) U.S. Cl. .............. 257/99; 257/94; 257/79; 257/103; 257/195; 257/96; 257/97; 257/98; 257/E33.065
(58) Field of Classification Search ............ 257/79, 257/94–99, 103, E33.065
See application file for complete search history.

(56) References Cited

U.S. PATENT DOCUMENTS

| 6,107,644 | A | 8/2000 | Shakuda et al. |
| 6,495,862 | B1* | 12/2002 | Okazaki et al. ............... 257/103 |
| 6,514,782 | B1 | 2/2003 | Wierer, Jr. et al. |
| 6,924,163 | B2 | 8/2005 | Okazaki et al. |
| 7,125,734 | B2* | 10/2006 | Sackrison et al. ............... 438/25 |
| 2005/0173725 | A1 | 8/2005 | Kunisato et al. |
| 2007/0272930 | A1* | 11/2007 | Tseng et al. ................... 257/79 |

FOREIGN PATENT DOCUMENTS

| CN | 2760762 Y | 2/2006 |
| CN | 1776926 | 5/2006 |
| JP | 335622 | 12/1993 |
| WO | WO 2005/065325 | 7/2005 |
| WO | 2005106497 | 11/2005 |

* cited by examiner

*Primary Examiner* — Cuong Q Nguyen
*Assistant Examiner* — Tran Tran
(74) *Attorney, Agent, or Firm* — Bacon & Thomas, PLLC (57) ABSTRACT

This invention provides a light-emitting element and the manufacture method thereof. The light-emitting element is suitable for flip-chip bonding and comprises an electrode having a plurality of micro-bumps for direct bonding to a submount. Bonding within a relatively short distance between the light-emitting device and the submount can be formed so as to improve the heat dissipation efficiency of the light-emitting device.

9 Claims, 8 Drawing Sheets

LIGHT EMITTING DEVICE AND THE MANUFACTURE METHOD THEREOF

REFERENCE TO RELATED APPLICATION

The present application claims the right of priority based on Taiwan Application Serial Number 095132845, filed on Sep. 5, 2006, the disclosure of which incorporated herein by reference in its entirety.

TECHNICAL FIELD

The present invention relates to a light-emitting element, and more particularly, to a light-emitting element comprising an electrode comprising a plurality of micro-bumps.

BACKGROUND

Figure 1:
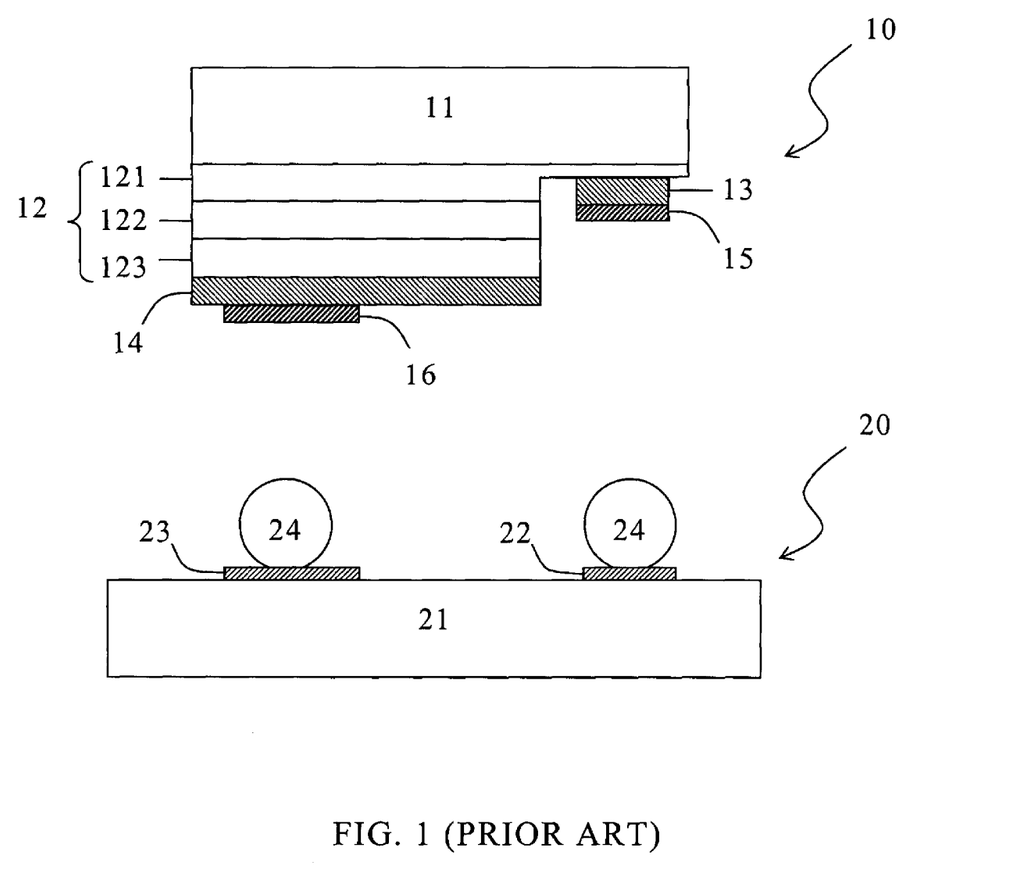
FIG. 1 shows a schematic diagram of a light-emitting element according to a prior art.

Employing light emitting diode (LED) in high power illumination, besides continuously promoting brightness, heat dissipation is another main problem that is indeed necessary to be solved. When light extraction efficiency is not good, the light, which cannot pierce a light-emitting device including LED and its encapsulant, transforms into heat. If the heat cannot be dissipated out of the light-emitting device effectively, the temperature is going to raise during operation. Thus, reliability problem comes out. Prior arts provide a lot of methods for solving the problem of heat dissipation of elements. Taking a light-emitting element having GaN series grown on a sapphire substrate as example, double transfer method is used to remove the sapphire substrate with worse heat dissipation by laser lift-off or chemical etching, then a silicone substrate with better heat dissipation is connected to the light-emitting element in order to improve the heat dissipation effect of the light-emitting element. Another improving method is to take flip-chip bonding to replace traditional wire bonding. FIG. 1 shows that a known light-emitting device with flip-chip bonding comprises a LED 10 and a submount unit 20. Solder bumps 24 are formed on a first bond pad 22 and a second bond pad 23, for connecting the LED 10 to the submount unit 20 in a bonding process. The solder bumps 24 are formed on the first bond pad 22 and second bond pad 23 one by one through the gold stud bump method. Through thermosonic bonding method, ultrasonic wave is provided on the junction of the solder bumps 24 of the submount unit 20 and electrodes 15 and 16 of the LED 10 to make the junction quickly rub to produce high heat for melting and bonding. Generally, diameter of a gold stud is about 50 um. Dimension of every gold stud must be close to avoid that the short gold stud cannot tough the junction to influence the characteristics of products and bonding performance. In addition, because the gold stud is that the front of a gold wire is melted to become a spheroid and then is bonded on the submount through thermosonice bonding, dimension of the gold stud is restricted to that of the gold wire not to be further contracted. Thickness is still larger than 20 um after bonding so the thermal resistance between the LED 10 and a submount 21 cannot be reduced. Thus, the application of the LED 10 in the high power device is restricted.

Therefore, this invention provides a light-emitting element which is applicable to direct flip-chip bonding, without additional solder bump on the submount. This invention also comprises the advantages of wide bonding area, short bonding distance, high heat dissipation, great reliability, and low cost.

SUMMARY OF THE INVENTION

This invention provides a light-emitting element and the manufacture method thereof. The light-emitting element is suitable for flip-chip bonding and comprises an electrode having a plurality of micro-bumps for directly bonding to a submount. A bonding within a relatively short distance between the light-emitting device and the submount can be formed so as to improve the heat dissipation efficiency of the light-emitting device.

Another object of this invention is to provide a light-emitting element, comprising a transparent substrate, a first electricity semiconductor layer formed on the transparent substrate, an active layer formed on the first type semiconductor layer, a second electricity semiconductor layer formed on the active layer, a contact layer formed on the second type semiconductor layer, and an electrode having a plurality of micro-bumps, formed on the contact layer for directly bonding to a submount. The plurality of micro-bumps is formed on the electrodes out of one piece.

The other object is to provide a light-emitting element comprising an LED, a submount, and a plurality of micro-bumps. The LED comprises a transparent substrate and at least one electrode. The submount comprises at least one bond pad. The plurality of micro-bumps is located on the intermediate between the electrode and the bond pad, and is formed on the electrode or bond pad out of one piece.

An additional object is to provide a manufacture method of a light-emitting element comprising providing an LED comprising a transparent substrate and at least one electrode, and forming a plurality of micro-bumps on the electrode. The plurality of micro-bumps is formed on the electrode out of one piece.

DETAILED DESCRIPTION OF THE PREFERRED EMBODIMENTS

Figure 2:
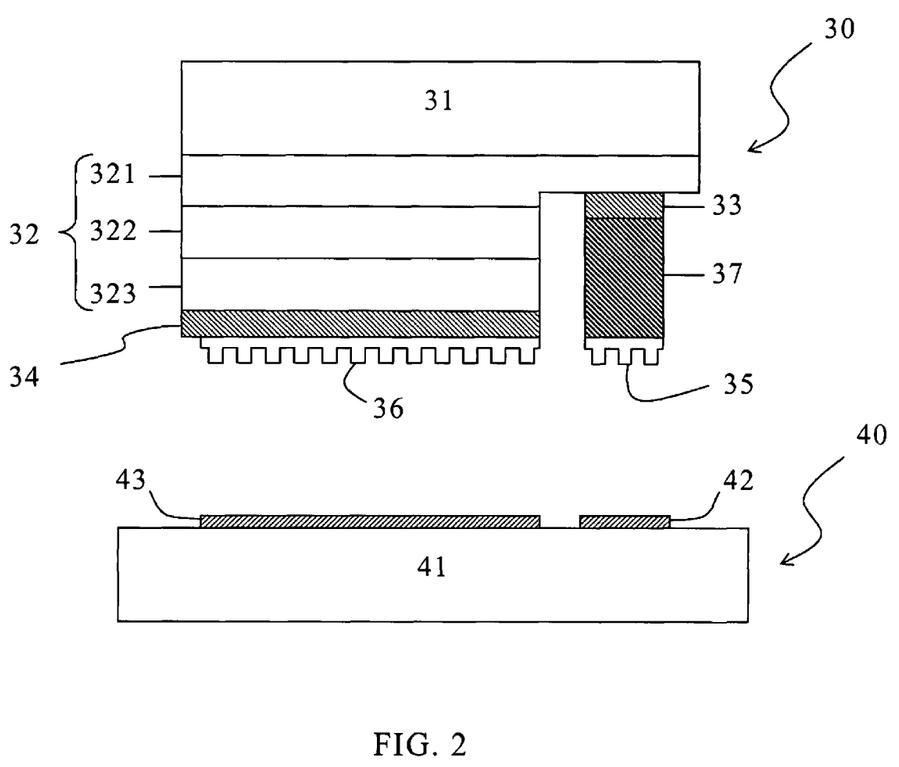
FIG. 2 shows a schematic diagram of one embodiment of a light-emitting element according to this invention.
Figure 3:
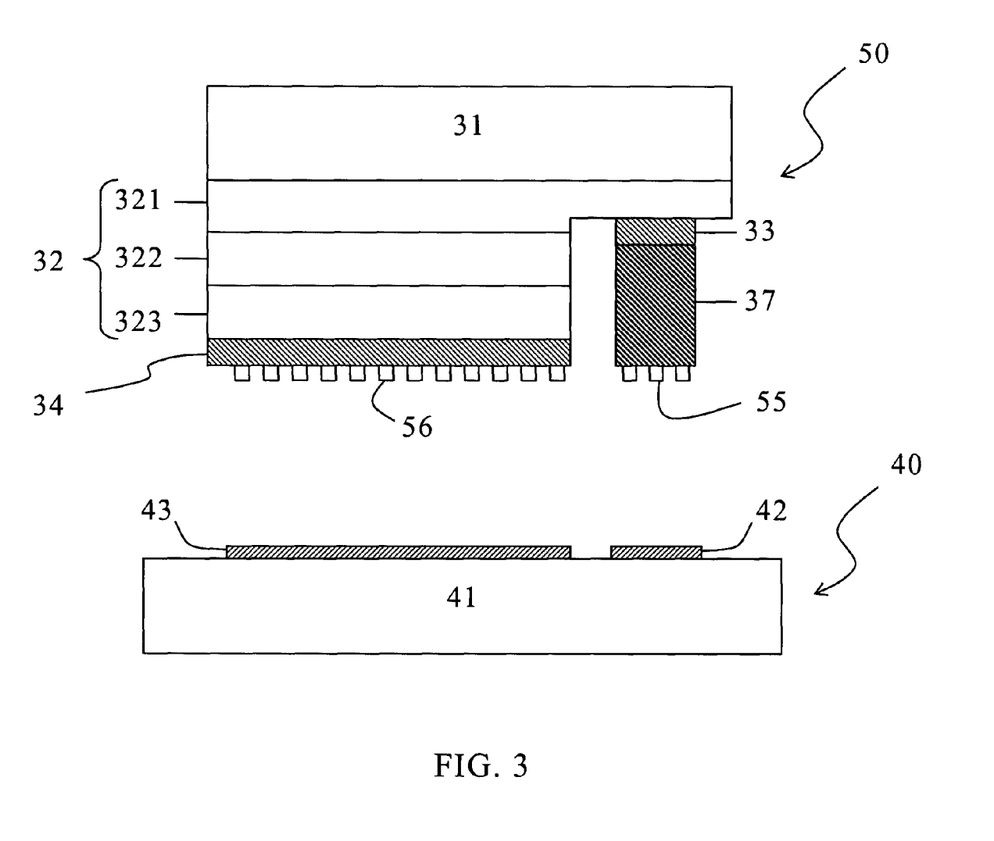
FIG. 3 shows a schematic diagram of another embodiment of the light-emitting element according to this invention.

In FIG. 2, a light-emitting element comprises an LED 30 and a submount unit 40. The LED 30 comprises a transparent substrate 31, a light-emitting stack 32, a first contact layer 32, a second contact layer 33, a first electrode 35, and a second electrode 36. The transparent substrate 31 comprises at least one material selected from the group consisting of $Al_2O_3$, GaN, Glass, Gap, Sic, and CVD diamond. The light-emitting stack 32 is formed on the transparent substrate 31 and emits light when receiving a forward voltage. Color of the light depends on the material of the light-emitting stack 32. For example, the material of $(Al_zGa_{1-z})_{0.5}In_{0.5}P$ series can emit red light, yellow light, or green light in accordance with the value of z. The material of $Al_xIn_yGa_{(1-x-y)}N$ series can emit blue light or purple light in accordance with the combination of the value of x and y. The light-emitting stack 32 comprises a first electricity semiconductor layer 321, an active layer 322, and a second electricity semiconductor 323. The first electricity semiconductor layer 321 can be n type or p type semiconductor layer, and the electricity thereof is opposite to that of the second electricity semiconductor layer 323. Portions of the second electricity semiconductor layer 323 and the active layer 322 are removed to expose a portion of the first electricity semiconductor layer 321 by etching. The first contact layer 33 is formed on the exposed portion of the first electricity semiconductor layer 321, and the second contact layer 34 is formed on the second electricity semiconductor layer 323. The first contact layer 32 and the second contact layer 34 are used to form ohmic contact with the first electricity semiconductor 321 and the second electricity semiconductor layer 323 respectively. The material of the first contact layer 33 or the second contact layer 34 is selected form the group consisting of BeAu, ZnAu, SiAu, and GeAu. The first electrode 35 is formed on the first contact layer 33 and the second electrode 36 is formed on the second contact layer 34. In one embodiment, the LED 30 further comprises an electrode pad layer 37 formed on the intermediate between the second contact layer 34 and the second electrode 36. Thus, the upper surfaces of the second electrode 36 and the first electrode 35 are substantially located on the same level. The first electrode 35 or the second electrode 36 comprises at least one material selected from the group consisting of Au, Ag, Al, and Cu. The material of the electrode pad layer 37 can be the same as that of the second electrode 36, the second contact layer 34, or other metal materials. There is a plurality of micro-bumps formed on the surfaces of the first electrode 35 and the second electrode 36. When the plurality of micro-bumps is directly bonded to a submount unit 40, taking the printed circuit board (PCB) as example, current conducts to the submount via the plurality of micro-bumps functioning as a plurality of current channels. The method of direct bonding can be thermosonic bonding to directly bond the plurality of micro-bumps to the submount unit 40. The submount unit 40 comprises a submount 41, and a first bond pad 42 and a second bond pad 43 formed on the submount 41 to be bonded to the first electrode 35 and the second electrode 36 respectively. The submount 41 comprises a substance with good heat dissipation, comprising at least one material selected from the group consisting of Si, SiC, AlN, CuW, Cu, and CVD diamond. The first bond pad 42 or the second bond pad 43 comprises a metal or an alloy material, for example, alloy of Au, Ag, Al, or Sn. In one embodiment, through known lithography and etching, the plurality of micro-bumps can be patterned and a portion of depth of the electrode layer can be etched to form the plurality of micro-bumps. Thickness of the plurality of micro-bumps is between 0.3 um and 20 um, and the shape thereof can be a polygon, a circle, or a rectangle. Dimension of the plurality of micro-bumps, for example, length of the shortest side of the polygon, diameter of the circle, or length of short sides of the rectangle is between 1 um and 250 um. In a preferred embodiment, thickness of the smallest micro-bump is 0.3 um. After bonding, the plurality of micro-bumps can offer short bonding distance to reduce the thermal resistance between the LED 30 and the submount element 40, and can own acceptable shear strength to maintain great bonding. In another embodiment, FIG. 3 shows that electrodes 55 and 56 are the plurality of micro-bumps separate among each other. They also can be formed by known lithography or etching, or alternatively by electroplate or film growth.

Figure 4:
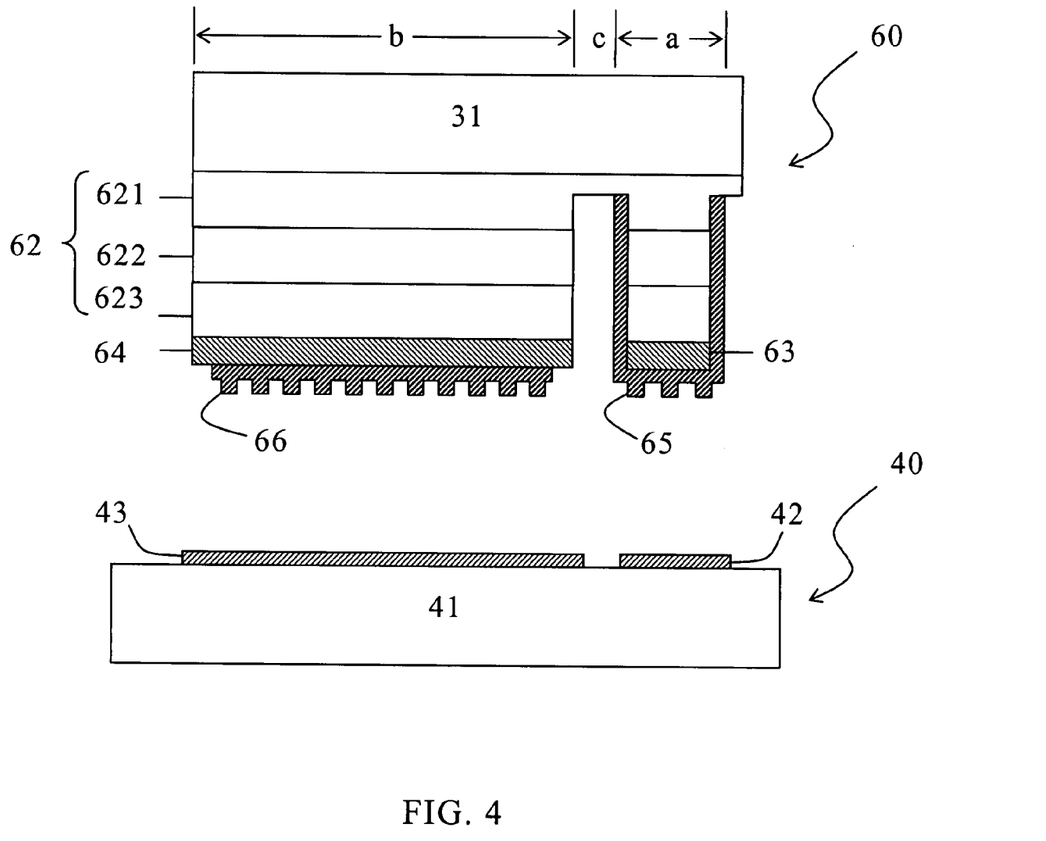
FIG. 4 shows a schematic diagram of another embodiment of the light-emitting element according to this invention.

In FIG. 4, another embodiment is that a light-emitting element comprises an LED 60 and a submount unit 40. The LED 60 comprises a transparent substrate 31, a light-emitting stack 62, a first contact layer 63, a second contact layer 64, a first electrode 65, and a second electrode 66. The transparent substrate 31 comprises a first region a, a second region b, and a trench c. The light-emitting stack 62 formed on the first region a and second region b of the transparent substrate 31 comprises a first electricity semiconductor layer 621, an active layer 622, and a second electricity semiconductor layer 623 in order. The light-emitting stack 62 located on the first region a and the second region b is connected to the transparent substrate 31 by the first electricity semiconductor layer 621. The first contact layer 63 is formed on the second electricity semiconductor layer 623 of the first region a, and the second contact layer is formed on the second semiconductor layer 623 of the second region b. The first electrode 65 is formed on the first contact layer 63, and the second electrode 66 is formed on the second contact layer 64. Because the light-emitting stack 62 under the first electrode 65 is not removed, the first electrode 65 and the second electrode 66 can maintain on the same level. The first electrode 65 and the second electrode 66 comprise a plurality of micro-bumps for providing a plurality of current channels to conduct the current from the plurality of micro-bumps to the submount when directly bonded to the submount unit 40. The direct bonding method can utilize thermosonic bonding to directly bond the plurality of micro-bumps to the submount unit 40. Through known lithography and etching, the plurality of micro-bumps can be patterned and a portion of depth of the electrode layer can be etched to form the plurality of micro-bumps. Thickness of the plurality of micro-bumps is between 0.3 um and 20 um, and the shape thereof can be a polygon, a circle, or a rectangle. Dimension of the plurality of micro-bumps, for example, length of the shortest side of the polygon, diameter of the circle, or length of short sides of the rectangle is between 1 um and 250 um. In a preferred embodiment, thickness of the smallest micro-bump is 0.3 um. After bonding, the plurality of micro-bumps can offer short bonding distance to reduce the thermal resistance between the LED 30 and the submount element 40, and can own acceptable shear strength to maintain great bonding. In another embodiment, the first electrodes 65 and the second electrode 56 are the plurality of micro-bumps separate among each other. They also can be formed by known lithography or etching, or alternatively by electroplate or film growth.

Figure 5:
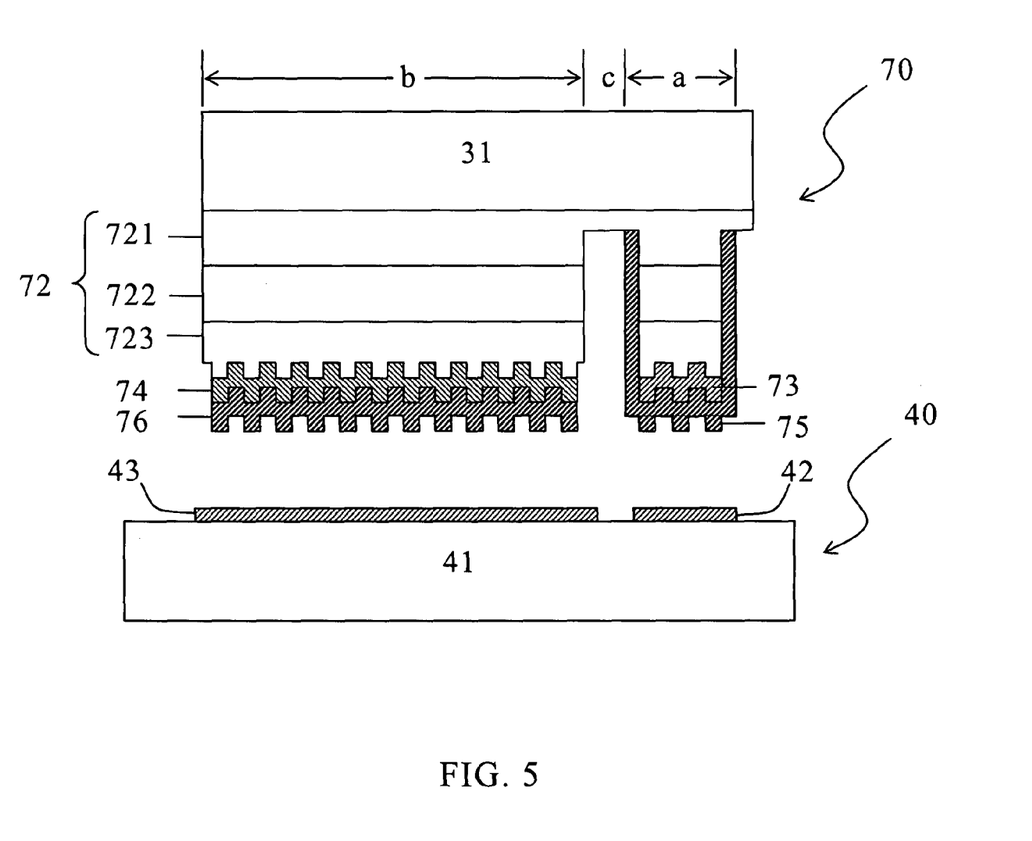
FIG. 5 shows a schematic diagram of another embodiment of the light-emitting element according to this invention.

In another embodiment, FIG. 5 shows that an LED 70 comprises a transparent substrate 31, a light-emitting stack 72, a first contact layer 73, a second contact layer 74, a first electrode 75, and a second electrode 76. The transparent substrate 31 comprises a first region a, a second region b, and a trench c. The light-emitting stack 72 formed on the first region a and the second region b of the transparent substrate 31 comprises a first electricity semiconductor layer 721, an active layer 722, and a second electricity semiconductor layer 723 in order, wherein the surface shape of the second semiconductor layer 723, is uneven. Moreover, the light-emitting stack 72 located on the first region a and the second region b is connected to the transparent substrate 31 by the first electricity semiconductor layer 721. Conforming to the surface shape of the second semiconductor layer 723, the first contact layer 73 is formed on the second electricity semiconductor layer 723 of the first region a, and the second contact layer 74 is formed on the second semiconductor layer 723 of the second region b respectively. Conforming to the surface shapes of the first contact layer 73 and the second contact layer 74, the first electrode 75 is formed on the first contact layer 73, and the second electrode 76 is formed on the second contact layer 74 respectively. Thus, there is a plurality of micro-bumps formed on the surfaces of the first electrode 75 and the second electrode 76 for providing a plurality of current channels to conduct the current from the plurality of micro-bumps to the submount when directly bonded to the submount unit 40. The direct bonding method can utilize thermosonic bonding to directly bond the plurality of micro-bumps to the submount unit 40. In one embodiment, the uneven shape of the second electricity semiconductor layer 723 is formed by known lithography. The first electrode 75 and the second electrode 76 are formed on the second electricity semiconductor layer 723 by depositing an electrode layer of the contact layer conforming to the second electricity semiconductor layer 723, then the known method, like lithography or lift-off, is utilized to remove the contact layer and the electrode layer in the trench. Thickness of the plurality of micro-bumps of the first electrode 75 and the second electrode 76 is between 0.3 um and 20 um, and the shape thereof can be a polygon, a circle, or a rectangle. Dimension of the plurality of micro-bumps, for example, length of the shortest side of the polygon, diameter of the circle, or length of short sides of the rectangle is between 1 um and 250 um. In a preferred embodiment, thickness of the smallest micro-bump is 0.3 um. After bonding, the plurality of micro-bumps can offer short bonding distance to reduce the thermal resistance between the LED 30 and the submount unit 40, and can own acceptable shear strength to maintain great bonding. In another embodiment, the second electricity semiconductor layer 723 comprises a plain surface and the contact layer comprises the uneven surface. Conforming to the surface shape of the contact layer, the following electrode layer covers the contact layers to make the surface of the electrode have the shape of the micro-bump.

In another embodiment, utilizing the inventive theory disclosed in FIG. 2 and FIG. 3, it also can achieve the same bonding effect that a plurality of micro-bumps are formed on the first bond pad 42 and the second bond pad 43 of the submount unit 40.

Figure 6:
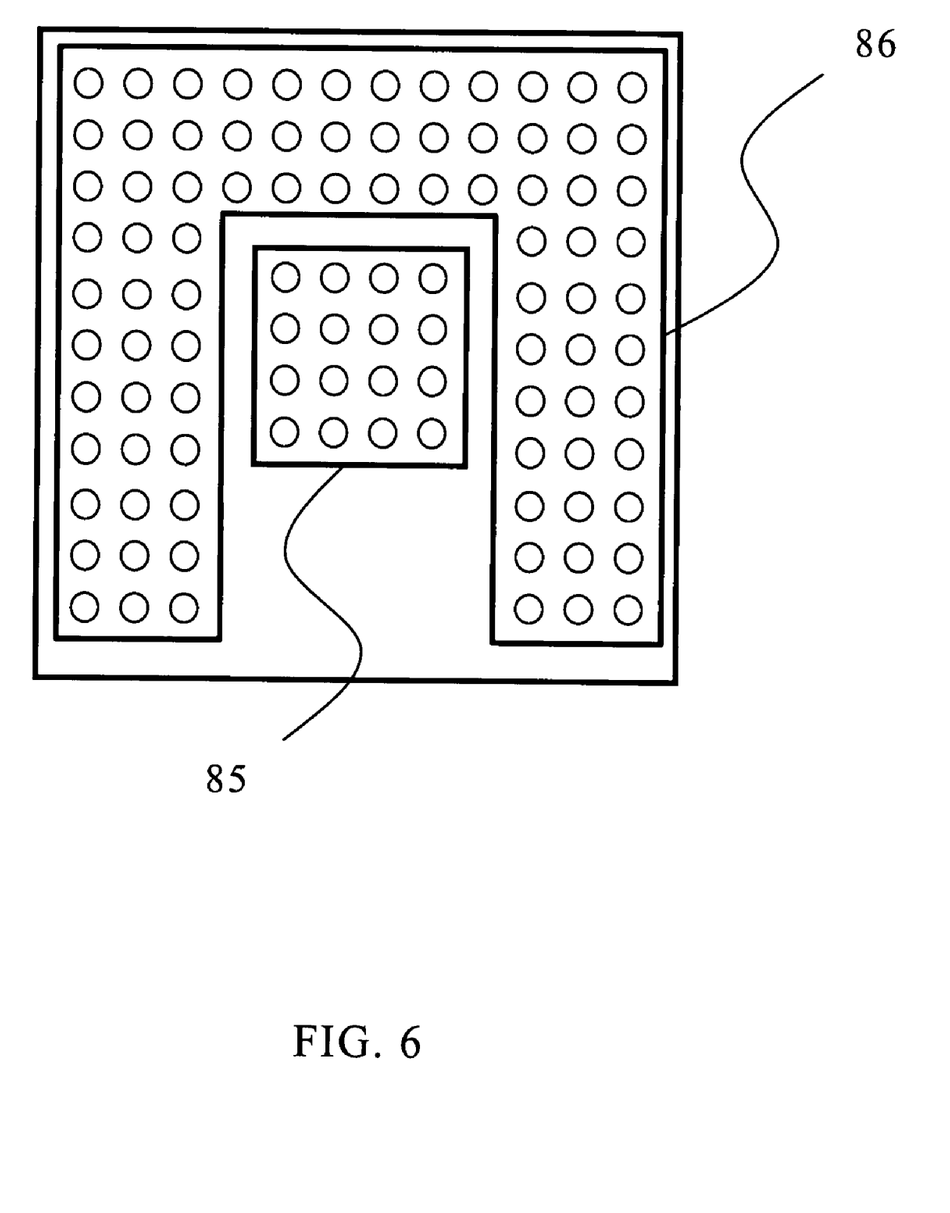
FIG. 6 shows a top plan view of an electrode according to this invention.
Figure 7:
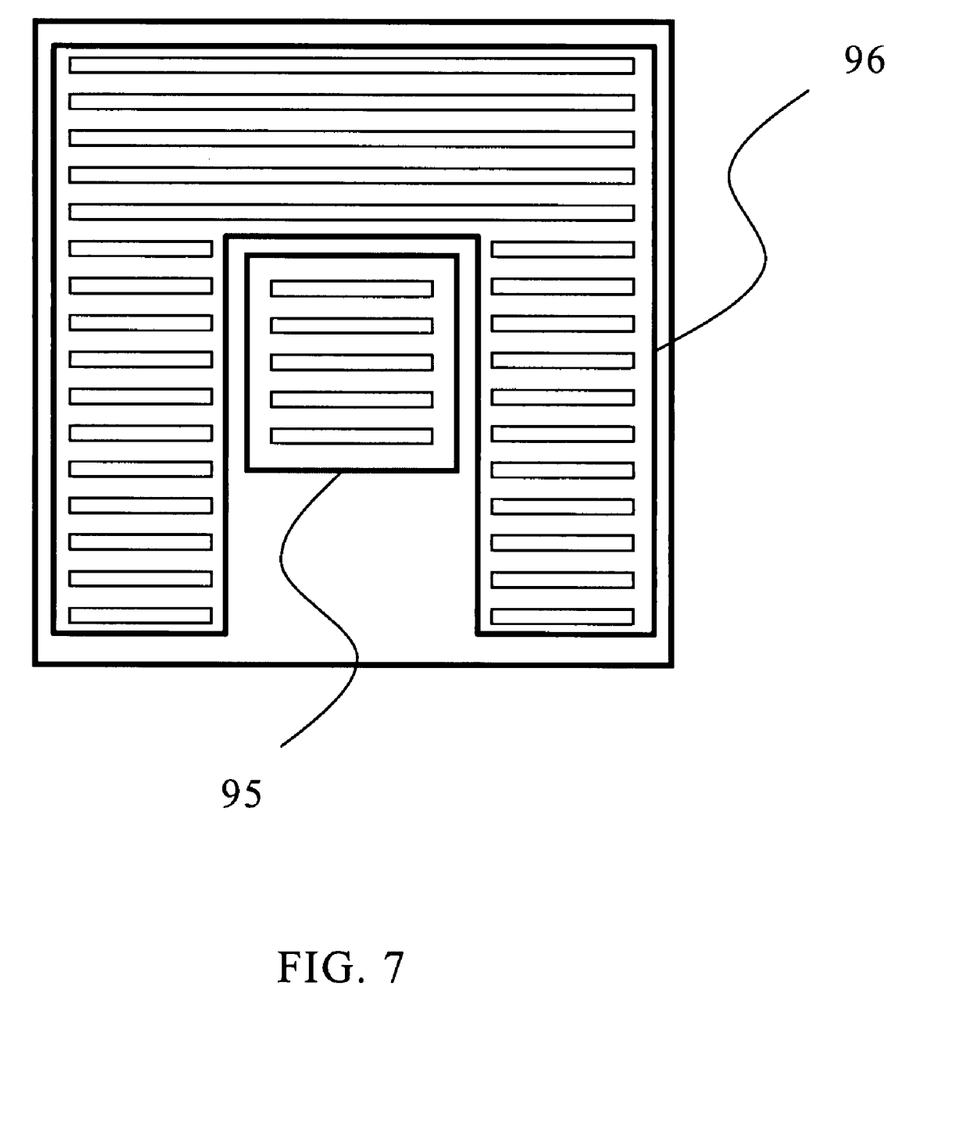
FIG. 7 shows a top plan view of another electrode according to this invention.

FIG. 6 and FIG. 7 are embodiments of the electrodes disclosed in this invention. FIG. 6 and FIG. 7 show that a plurality of micro-bumps of the first electrode 85 and 95 or the second electrode 86 and 96 are circular or rectangular and an array. For obtaining preferred bonding effect, dimension and arrangement of the plurality of micro-bumps can be adjusted, or the bonding area, summation of the surface areas of the plurality of micro-bumps, can be increased. With the increasing of the bonding area, the requirement of smoothness of the electrodes raises to avoid bad bonding of a portion of the hollow area resulting from variety of the plurality of micro-bumps' thickness or bending resulting from chip stress. The ratio of the bonding area to the area surrounded by the electrodes is between 5% and 50%.

Figure 8:
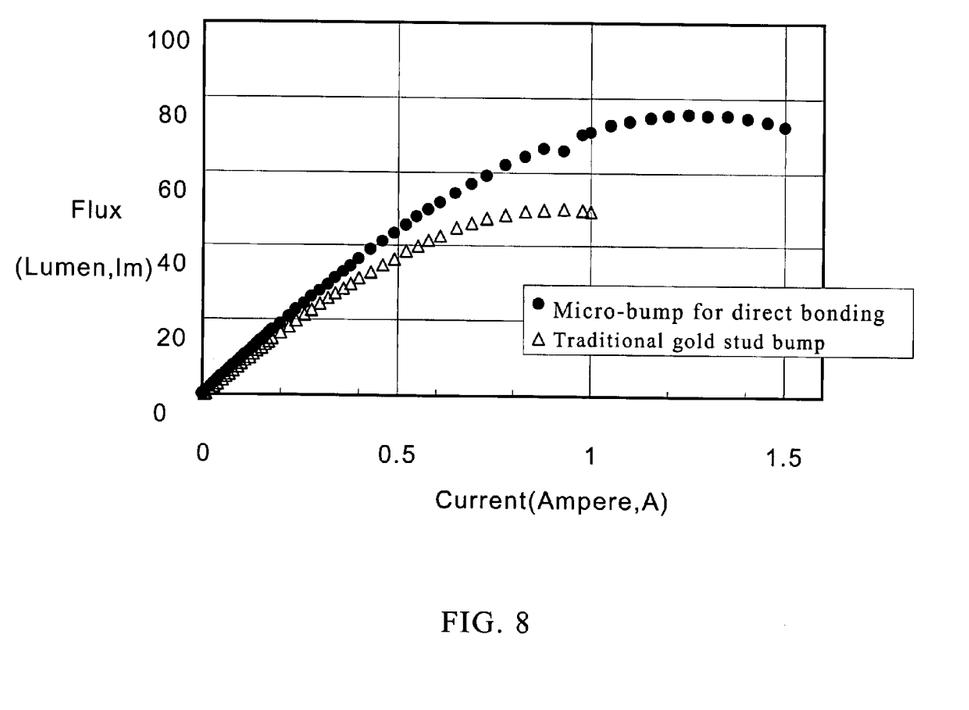
FIG. 8 shows a diagram of efficiency of current and flux measured from this invention.

FIG. 8 shows that comparison of the effective curve of the traditional gold stud bond method and the direct bonding method of this invention. In this embodiment, the plurality of micro-bumps of the electrode is the circle with 10 um diameter and arrayed. It occupies 5% of the electrodes' total area, equivalent to the contact area of the gold stud. In accordance with the curve in the diagram, the flux directly proportionates to the passing current. However, with increasing of the current, the flux can become saturating gradually. Applying a light-emitting element with a traditional gold stud bonding structure, the saturating current is about 0.7 A and the greatest flux is about 50 l m. Nevertheless, the saturating current measured from the light-emitting element with direct bonding structure is about 1.2 A and the greatest flux is about 75 l m, raising about 50%. The following table is the comparison of the measured value of thermal resistance. According to the following table, the thermal resistance between the light-emitting element and the submount unit of this invention is far lower than that between the traditional light-emitting element and the traditional submount unit. In summary, this invention has the improved effect of low thermal resistance and high luminance.

| Bonding Method | $V_f[V]$ | $I_f[A]$ | $\Delta T[K]$ | Thermal Resistance [° C./W] |
|---|---|---|---|---|
| Gold Ball Bonding | 0.35 | 2.25 | 30.4 | 38.6 |
| Au—Au Direct Bonding | 0.35 | 2.26 | 15.6 | 19.7 |

It should be noted that the proposed various embodiments are not for the purpose to limit the scope of the invention. Any possible modifications without departing from the spirit of the invention may be made and should be covered by the invention.

What is claimed is:

1. A light-emitting element for bonding to a submount, the light-emitting element comprising:
   a transparent substrate;
   a first electricity semiconductor layer formed on the transparent substrate;
   an active layer formed on the first electricity semiconductor layer to receive a forward voltage to emit light;
   a second electricity semiconductor layer formed on the active layer, comprising an uneven surface shape;
   a contact layer formed on the second electricity semiconductor layer, said contact layer having an uneven surface shape conforming to the uneven surface shape of the second electricity semiconductor layer and forming ohmic contact therebetween;
   an electrode formed on the contact layer, said electrode having an uneven surface shape conforming to the uneven surface shape of the contact layer to make the surfaces of the electrode have a plurality of micro-bumps to bond the light-emitting element to a submount via the plurality of micro-bumps, wherein the plurality of micro-bumps provides a plurality of current channels.

2. The light-emitting element according to claim 1, wherein thickness of the plurality of micro-bumps is between 0.3 um and 20 um.

3. The light-emitting element according to claim 1, wherein ratio of summation of surface areas of the plurality of micro-bumps to that of the electrode is between 5% and 50%.

4. The light-emitting element according to claim 1, wherein the shape of the plurality of micro-bumps is selected form the group consisting of a circle, a rectangle, a polygon, and the combination thereof.

5. The light-emitting element according to claim 4, wherein diameter of the plurality of circular micro-bumps is between 1 um and 250 um.

6. The light-emitting element according to claim 4, wherein length of short sides of the plurality of rectangular micro-bumps is between 1 um and 250 um.

7. The light-emitting element according to claim 1 further comprising a submount bonded to the plurality of micro-bumps of the electrode by a direct bonding method.

8. The light-emitting element according to claim 7, wherein the direct bonding method is thermosonic bonding.

9. The light-emitting element according to claim 7, wherein the submount comprises a printed circuit board.

* * * * *